United States Patent [19]

Seppalä

[11] Patent Number: 5,507,018

[45] Date of Patent: Apr. 9, 1996

[54] METHOD AND A DEVICE FOR CONTROLLING A RADIO TRANSMITTER

[75] Inventor: Seppo Seppalä, Oulu, Finland

[73] Assignee: Nokia Telecommunications Oy, Espoo, Finland

[21] Appl. No.: 411,925

[22] Filed: Mar. 28, 1995

Related U.S. Application Data

[63] Continuation of Ser. No. 117,023, filed as PCT/FI92/00066, Mar. 5, 1992, abandoned.

[30] Foreign Application Priority Data

Mar. 6, 1991 [FI] Finland ............................ 911136

[51] Int. Cl.⁶ ............................................... H04B 1/04
[52] U.S. Cl. .......................... 455/127; 455/115; 370/95.3
[58] Field of Search ................................ 455/127, 38.3, 455/115, 67.1, 69, 70, 126, 53.1, 33.1; 370/79, 95.3

[56] References Cited

U.S. PATENT DOCUMENTS 4,754,231  6/1988  Sawa.
4,992,753  2/1991  Jenson et al. .
5,128,965  7/1992  Henriksson ........................... 455/69
5,199,031  3/1993  Dahlin ................................. 370/95.3

FOREIGN PATENT DOCUMENTS 0407135  1/1991  European Pat. Off. .
0414352  2/1991  European Pat. Off. .

OTHER PUBLICATIONS

Insko publication 121–89 X.

Primary Examiner—Reinhard J. Eisenzopf
Assistant Examiner—Doris To
Attorney, Agent, or Firm—Cushman Darby & Cushman

[57] ABSTRACT

A method and a device for controlling the power of a control channel (BCCH) in a radiotelephone system, such as the GSM mobile radio network. In the method, the power of the control channel (BCCH) is kept constant during normal operation. To enable easy control of the constant power of the control channel, power data is transmitted on the control channel (BCCH) at least in the first time slot of the frame and the power of the control channel is locked throughout each frame to a level determined in the first time slot.

4 Claims, 2 Drawing Sheets

METHOD AND A DEVICE FOR CONTROLLING A RADIO TRANSMITTER

This is a continuation of application Ser. No. 08/117,023, filed as PCT/FI92/00066, Mar. 5, 1992, which was abandoned upon the filing hereof.

BACKGROUND OF THE INVENTION

The invention relates to a method and a device for controlling the power of a control channel in a radiotelephone system. In the method and device, the power of the control channel is kept constant during normal operation.

The method and the device according to the invention can be used, e.g., in the GSM mobile radio network, but it is equally applicable to radio systems of other types in which the channels are divided into separate traffic and control channels.

In the GSM radio system, the traffic channels utilize dynamic control of transmitting power both at the base station and at mobile stations. The power control word comprises four bits, which means that there are 16 power levels available. The spacing between two successive power levels is 2 dB, and so the entire power control range is 30 dB. In a so-called TX-on time slot, in which the transmission takes place, the transmitting power is adjusted in each time slot of the frame to one of the 16 different power levels in accordance with the above-mentioned power control word. A so-called TX-off time slot, in turn, is a time slot in which no transmission occurs (the RF power is zero). In this connection, EP Patent Application 414352 A2 is referred to, which describes in more detail both the GSM system and a radio transmitter belonging to it, the transmitting power of the radio transmitter being adjustable in the TX-on time slot to one of the above-mentioned 16 power levels.

One of the control channels of the GSM system is a broadcast control channel (BCCH) which is a one-way channel from the base station to a mobile station. (The control channels and the frame structure of the GSM system are described in greater detail e.g. in INSKO publication 121–89 GSM-yleiseurooppalainen matka-puhelinverkko [GSM Pan-European mobile radio network], Chapters X and XI.) The broadcast control channel transmits data concerning one specific cell (about power levels, frequencies, etc.) to the mobile station. The power control of the mobile station is based on measurements performed by the base station, and vice versa. As the measurements performed by the mobile station must have a reference level, the power transmitted at the BCCH frequency is constant in each cell. However, this power is not the same as the maximum power of the transmitter. Therefore the power of the BCCH channel should also be controllable.

SUMMARY OF THE INVENTION

The object of the present invention is to provide a method and a device which enable the (constant) power of the control channel to be controlled easily and simply. This is achieved by means of a method according to the invention in such a way that power data is applied to the transmitter in the time slots of the frame, in the case of a control channel frame, and the power of the control channel is locked throughout each frame to a level determined in the first time slot.

The basic idea of the invention is that power data is transmitted also on the control channel at least in the first time slot of each frame, whereas the power of the entire frame is locked in this control channel transmission to the power level determined in the first time slot while ignoring the power control orders received in the other time slots.

By means of the arrangement of the invention, the (constant) power of the BCCH channel of the GSM system, for instance, is easy to control and it is possible to use the same units as on the traffic channels irrespective of the nominal power level of the base station.

BRIEF DESCRIPTION OF THE DRAWING

In the following the invention will be described in more detail with reference to the attached drawings, in which.

DETAILED DESCRIPTION

Figure 1:
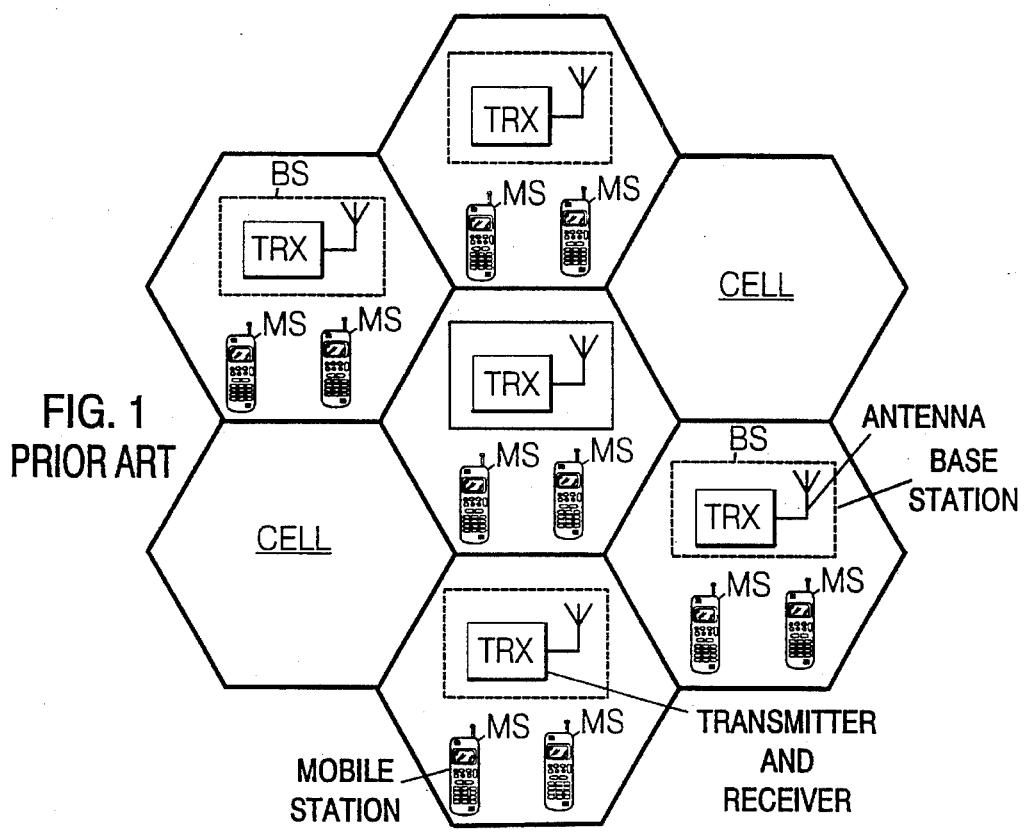
FIG. 1 is a diagrammatic illustration of a multiple-cell GSM mobile radio network.

FIG. 1 illustrates seven cells of the GSM mobile radio network, each cell being formed by a base station which serves mobile stations moving in the area of this cell. Mobile stations communicate with their base station via a radio path. A base station comprises the radio transmission and reception devices TRX (transmitters and receivers) and the antennas.

Figure 2:
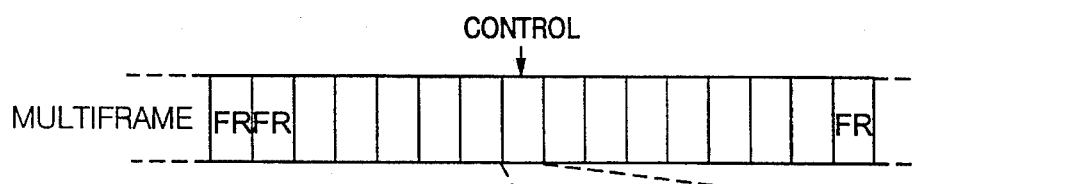
FIG. 2 and 3 are diagrammatic illustrations of the base format of multiple time slot frames of the data transmission scheme of the GSM mobile radio network of FIG. 2.
Figure 3:
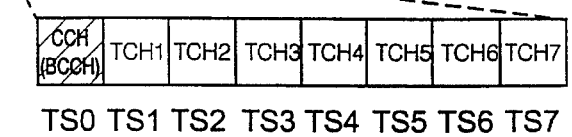
Figure 3:
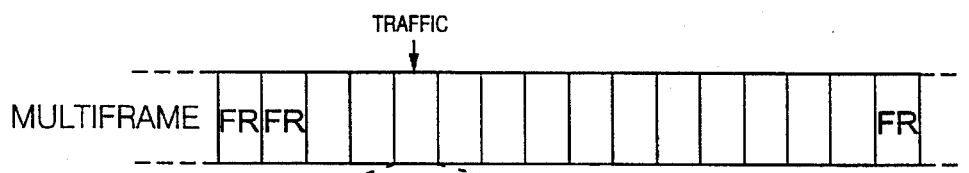
Figure 3:
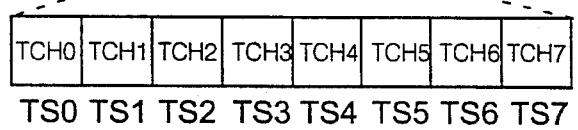

In a cellular network such as the GSM network, data is transmitted in successive frames each comprising a predetermined number of time slots. FIG. 2 and 3 illustrate a succession of frames and the basic format of one frame FR comprising eight multiplexed time slots TS0 . . . TS7. A frame can include only traffic channels TCH, as shown in FIG. 2, or it can also include a control channel CCH, like the broadcast control channel BCCH shown in FIG. 3. (The broadcast control is always in the first time slot TS0 of a frame of a control channel carrier, not in each frame.)

Figure 4:
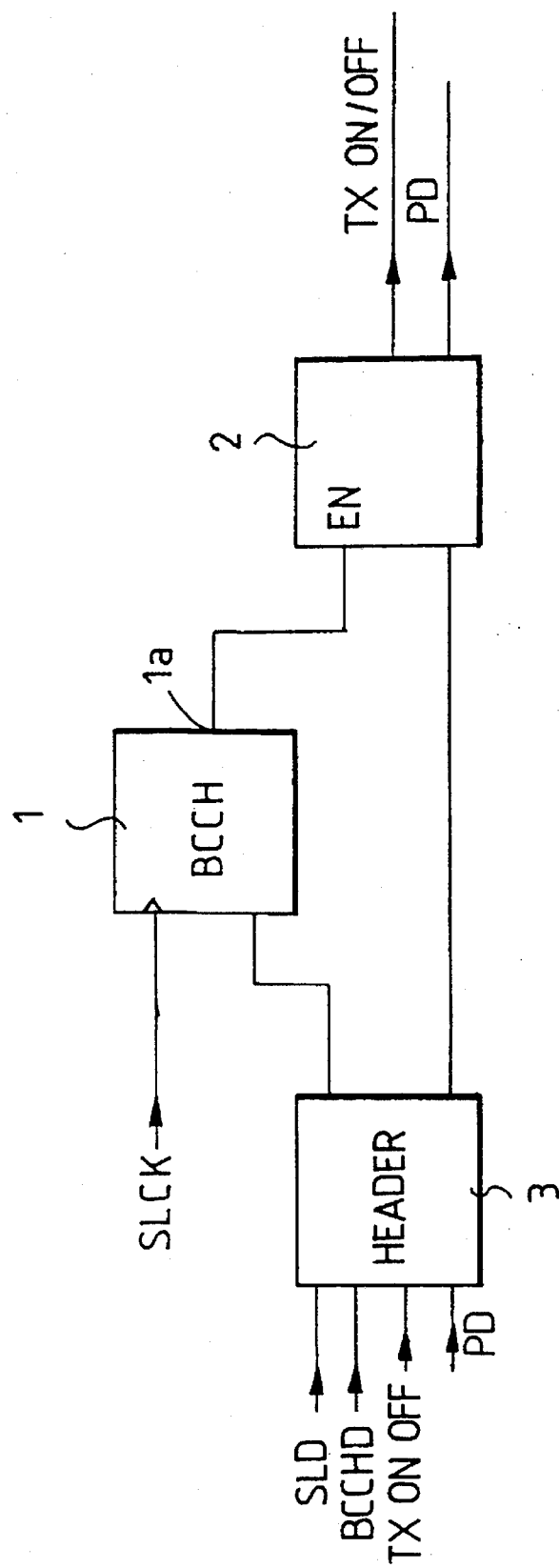
FIG. 4 is a diagrammatic view illustrating an example of the power control of a BCCH transmission according to the invention.

As already mentioned above, the power of the BCCH transmission must be kept constant. Data about the BCCH transmission can be received only in the first time slot of the frame. The power control arrangement according to the invention comprises a BCCH counter 1, (FIG. 4) to the input of which a time slot clock SLCK is coupled (a time slot clock being a clock generating one pulse per time slot) and which counts all the eight time slots of the frame. The output 1a of the BCCH counter is coupled to the enable pin of a power level buffer 2. The power level buffer is preceded by a header buffer 3 which stores the power level data PD of each time slot of the frame. The header buffer receives time slot data SLD, BCCH data BCCHD, TX-on/off data and power level data PD at its inputs. In connection with the BCCH transmission, the headers of each time slot which contain the power level data are separated from the data stream, as they should not be carried along with the data to be modulated. When the header buffer 3 identifies the BCCH transmission, it causes the BCCH counter 1 to admit only the power level data received in the time slot zero to the power level buffer 2. Power level data received in the other time slots of the frame of the BCCH transmission remain in the header buffer 3. After the BCCH data, the BCCH counter 1 counts the next seven time slots, whereafter new power data can again be triggered into the power level buffer 2.

If the transmission is not a BCCH transmission, the BCCH counter enables the power level buffer 2 to continuously receive new data. That is, the arrangement does not influence the transmission in any way, but the power level data PD and TX on/off data pass through the buffers in a normal way and are then applied to the control circuitry of the memory circuit, in which the power control voltages corresponding to the different power levels are stored. The memory circuit is described in greater detail in the parallel FI Patent Application 911134. The memory circuit with the microprocessor controlling it and the associated radio transmitter equipment may also be, e.g., such as described in the above-mentioned EP Patent Application.

Even though the invention has been described above with reference to the example of the attached drawing, it is to be understood that the invention is not restricted to it but it can be modified in many ways within the inventive idea described above and defined in the attached claims.

I claim:

1. A method for controlling the power of a control channel in a radiotelephone system which includes at least one base station for a respective cell, and at least one mobile station, the base station and mobile station being arranged to communicate by broadcasting signals, potentially at more than one among a plurality of predetermined power levels including a maximum power level, over a plurality of channels which include at least one traffic channel which at any instant is distinct from at least one control channel, in a succession of frames, each of which includes a succession of a fixed number of time slots, comprising:

transmitting power level data concerning said cell on said control channel, from said base station to said mobile station during at least the first time slot of a frame including said control channel, at a selected power level which is lower than said maximum power level; and locking the power level transmitted to said mobile station, on which said control channel transmits to said mobile station to said selected power level for the entirety of said frame including said control channel.

2. A digital cellular network system, comprising:

a plurality of base stations for respective radio cells;

at least one mobile station in each of a plurality of said cells, connected to respective of said base stations via respective radio paths;

each base station having a control channel for a respective cell, over which control data for the system concerning the respective cell is transmitted;

each said base station further comprising a transmitter transmitting data in successive frames, each of which includes a predetermined number of time slots;

means for controlling the power at which said control channel transmits to a respective said mobile radio station in said respective cell via a respective radio path, to remain constant throughout an entire frame including said control channel, at a power level provided to said transmitter in one predetermined time slot of said frame including said control channel.

3. The digital cellular network system of claim 2, wherein:

said predetermined time slot is the first time slot of said frame including said control channel.

4. A method for controlling the power of a base station transmitter in a radiotelephone system which includes at least one base station for a respective cell, and at least one mobile station, the base station and mobile station being arranged to communicate by broadcasting signals, potentially more than one among a plurality of predetermined power levels, over a plurality of channels which include at least one traffic channel which at any instant is distinct from at least one control channel, in succession of frames, each of which includes a succession of a fixed number of time slots, comprising:

applying power level data to the base station transmitter in the time slots of the frames, said power level data corresponding to a selected power level of the base station transmission in a respective time slot;

transmitting from said base station to said mobile station during a time slot of a frame at the selected power level corresponding to the power level data in said time slot; and locking the power level transmitted to said mobile station, on which said base station transmitter transmits to said mobile station, throughout each frame including said control channel, to the selected power level determined in the time slot corresponding said control channel.

* * * * *